United States Patent

Nishi

Patent Number: 5,737,441
Date of Patent: Apr. 7, 1998

[54] ALIGNING METHOD AND APPARATUS

[75] Inventor: Kenji Nishi, Yokohama, Japan

[73] Assignee: Nikon Corporation, Tokyo, Japan

[21] Appl. No.: 565,250

[22] Filed: Nov. 30, 1995

Related U.S. Application Data

[63] Continuation-in-part of Ser. No. 281,146, Jul. 27, 1994, abandoned, which is a continuation of Ser. No. 984,680, Dec. 2, 1992, abandoned.

[30] Foreign Application Priority Data

Dec. 12, 1991 [JP] Japan ................................. 3-328904
Apr. 27, 1995 [JP] Japan ................................. 7-103891

[51] Int. Cl.$^6$ ............................................. G06K 9/00
[52] U.S. Cl. ........................................ 382/151; 356/401
[58] Field of Search ................................ 382/144, 151; 250/559.1; 356/399, 400, 401

[56] References Cited

U.S. PATENT DOCUMENTS

| | | | |
|---|---|---|---|
| 4,325,077 | 4/1982 | Dunham | 358/101 |
| 4,699,515 | 10/1987 | Tanimoto | 356/401 |
| 4,720,635 | 1/1988 | Uga | 364/559 |
| 4,830,500 | 5/1989 | Kuroki et al. | 364/559 |
| 4,870,288 | 9/1989 | Abuku et al. | 364/559 |
| 4,977,048 | 12/1990 | Waldo, III | 430/22 |
| 4,981,529 | 1/1991 | Tsujita | 143/33 |
| 4,995,063 | 2/1991 | Enoki et al. | 378/70 |
| 5,003,342 | 3/1991 | Nishi | 355/43 |
| 5,020,006 | 5/1991 | Sporon-Fiedler | 364/550 |
| 5,050,111 | 9/1991 | Ayata et al. | 382/8 |

*Primary Examiner*—Andrew Johns
*Assistant Examiner*—Jayanti K. Patel
*Attorney, Agent, or Firm*—Shapiro and Shapiro

[57] ABSTRACT

A method of aligning a substrate on which a plurality of pattern areas are to be formed in a predetermined characteristic arrangement relative to a predetermined reference point comprises the step of setting the coordinates of the arrangement on the substrate and forming at least one pair of fiducial marks at design positions asymmetrical with respect to at least one axis of the coordinates, the step of detecting the locations of the fiducial marks relative to the reference point, and the step of moving the substrate in such a direction that the relative deviation between the detected locations and the reference point becomes a predetermined value.

9 Claims, 16 Drawing Sheets

ALIGNING METHOD AND APPARATUS

This application is a continuation-in-part of application Ser. No. 08/281,146 filed Jul. 27, 1994 (abandoned), which is a continuation of application Ser. No. 07/984,680 filed Dec. 2, 1992 (abandoned).

BACKGROUND OF THE INVENTION

1. Field of the Invention

This invention relates to an aligning apparatus in an exposure apparatus for the manufacture of semiconductive elements, and particularly to an apparatus for aligning a wafer which is not provided with an alignment reference such as an orientation flat or a notch relative to a predetermined reference position.

2. Related Background Art

Apparatuses of this kind according to the prior art have been for aligning a substrate (wafer) provided with a cut-away portion such as an orientation flat or a notch as shown in FIG. 8A or 8B of the accompanying drawings, and the construction thereof has been such as generally shown in FIG. 8C of the accompanying drawings. That is, a wafer 1 is placed on a wafer holder 6 rotatably supported by the rotary shaft 7 of a rotating mechanism such as a motor 8 so that the center of the wafer may substantially coincide with the center of rotation of the motor, and light beams are applied from a plurality of light sources 2 and 3 (or a single light source) to the marginal portion of the wafer 1. These light beams are usually intercepted by the marginal portion of the wafer 1, but when the cut-away portion of the wafer 1 exists at the positions of the light beams, the light beams are not intercepted by the wafer and are received by light receiving devices 4 and 5 disposed in opposed relationship with the light sources 2 and 3 with the wafer 1 interposed therebetween. Quantity-of-light signals detected by the light receiving devices 4 and 5 are input to a position detecting portion 31, which outputs information regarding the position of the cut-away portion of the wafer to a control portion 33 on the basis of the quantity-of-light signals. The control portion 33 outputs a signal to a rotation controlling portion 32 so as to rotate the wafer by a predetermined amount on the basis of the position information of the cut-away portion.

In the apparatus of the above-described construction, the wafer 1 has been rotated with the light beams applied to the marginal portion of the wafer 1 and any variations in the quantities of light of the light beams detected by the light receiving devices 4 and 5 have been examined, whereby the positioning of the orientation flat or the notch and the prealignment of the wafer have been effected. A position metering device such as a rotary encoder is provided on the rotating mechanism such as the motor 8 or on the wafer holder 6 and it is possible to meter the amount of rotation (the rotation angle) of the wafer.

FIGS. 9A and 9B of the accompanying drawings show the relations between the rotation angle θ of the wafer having the orientation flat and the outputs of the quantity-of-light signals detected by the light receiving devices 4 and 5. For example, in FIG. 8C, the rotation angle θ when the wafer 1 is placed and fired on the wafer holder 6 is defined as zero and the rotation controlling portion 32 rotates the wafer 1 in the direction of the arrows while monitoring the rotation angle θ. At that time, light beams are applied from the light sources 2 and 3 to the marginal portion of the wafer 1 and the light receiving device 4 first receives the light beam with the movement of the orientation flat. A quantity-of-light signal is obtained from the light receiving device 4 or 5 during the time when the orientation flat passes through the portion of the light beam (with regard to the light receiving device 4, during the time corresponding to a rotation angle $\theta_1$ to a rotation angle $\theta_2$, and with regard to the light receiving device 5, during the time corresponding to a rotation angle $\theta_3$ to a rotation angle $\theta_4$). A rotation angle substantially intermediate of the time when the output begins to be detected by the light receiving device 4 and the time when the output becomes no longer detected by the light receiving device 5 (substantially intermediate of the rotation angle $\theta_1$ and the rotation angle $\theta_4$) is found, and this position is defined as the central position of the orientation flat. On the basis of the found rotation angle and with the relations between the positions of the light sources 2, 3 and the light receiving devices 4, 5 and the position to which the orientation flat should be aligned taken into account, the wafer is rotated while being monitored by the position metering device such as the rotary encoder, whereby alignment is accomplished. In FIG. 9B, the letter A indicates the position of the orientation flat from after the start of rotation.

FIG. 9C of the accompanying drawings shows the relation between the rotation angle θ of the wafer having the notch and the output of the quantity-of-light signal detected by the light receiving device 4 or 5. In this case, the peak position of the signal is the position of the notch, and the alignment of this notch is similar to that in case of the wafer having the orientation flat. In FIG. 9C, the letter B indicates the position of the notch from after the start of rotation.

Generally, to form a circuit element on a wafer, it is necessary to pass through many steps, and when use is made of a wafer having a cut-away such as an orientation flat or a notch, as the steps progress, there has arisen the problem that the wafer becomes distorted (non-linear distortion occurs) due to the cut-away. Also, in an apparatus for exposing a wafer (a stepper), as a method of aligning the wafer (each exposure area) during superposition exposure, use is sometimes made of a method of measuring the positions of any several exposure areas, analogizing the position of other exposure areas on the basis of the measured positions, and effecting superposition exposure on the basis of the result. In this method, superposition exposure is effected on the assumption that the arrangement of the exposure areas on the wafer is linear and thus, the non-linear distortion of the wafer created due to the cut-away leads directly to the deterioration of alignment accuracy. In order to avoid the error due to such non-linear distortion, the use of a circular wafer having no cut-away is conceivable.

However, the prior-art technique as described above is applicable only to wafers formed with cut-away portions such as orientation flats or notches. In case of a wafer having no cut-away in the marginal portion thereof, a light beam cannot be received by a light receiving portion and therefore, the alignment by the prior-art apparatus has been impossible.

SUMMARY OF THE INVENTION

The present invention has been made in view of the above-noted problems and an object thereof is to provide an apparatus for and a method of effecting prealignment highly accurately even for a wafer formed with no orientation flat or notch (a circular wafer).

To solve the above-noted problems, according to the present invention, a method of aligning a substrate (1) on which a plurality of pattern areas (PA) are to be formed in a predetermined characteristic arrangement relative to a predetermined reference point (0') includes the step of setting the coordinates of a characteristic arrangement on the substrate (1) and forming at least one pair of fiducial marks (24, 25) at design positions asymmetrical with respect to at least one axis of said coordinates, the step of detecting the locations of the fiducial marks (24, 25) relative to the reference point (0'), and the step of moving the substrate (1) in such a direction that the relative deviation between the detected locations and the reference point (0') becomes a predetermined value.

Also, a method of aligning a substrate (1) on which a plurality of pattern areas (PA) are formed in a predetermined characteristic arrangement relative to a predetermined reference point (0') includes the step of forming at least two pattern areas (27), each of which has the same pattern as the pattern areas (PA) on the substrate (1) under a design arrangement condition differing from the characteristic arrangement when forming the pattern areas (PA) of the characteristic arrangement on the substrate (1), the step of detecting the locations of the areas (27) formed under the different arrangement condition relative to the reference point (0'), and the step of moving the substrate (1) in such a direction that the relative deviation between the detected locations and the reference point (0') becomes a predetermined value.

Further, an apparatus for aligning a substrate (1) on which a plurality of pattern areas (PA) are to be formed in a predetermined characteristic arrangement relative to a predetermined reference point (0') is provided with a stage (6) for setting the coordinates of a characteristic arrangement on the substrate (1), and holding the substrate (1) on which at least one pair of fiducial marks (24, 25) are formed at design positions asymmetrical with respect to at least one axis of said coordinates, detecting means (11, 35) disposed in predetermined positional relationship with the reference point (0') for detecting the locations of the fiducial marks (24, 25), and driving means (8) for moving the stage (6) in such a direction that the relative deviation between the detected locations and the reference point (0') becomes a predetermined value.

Also, an apparatus for aligning a substrate (1) on which a plurality of pattern areas (PA) are formed in a predetermined characteristic arrangement relative to a predetermined reference point (0') is provided with a stage (6) for holding the substrate (1) on which at least two pattern areas (27), each of which has the same pattern as the pattern areas (PA), are formed under a design arrangement condition differing from the characteristic arrangement, detecting means (11, 35 ) disposed in predetermined positional relationship with the reference point (0') for detecting the pattern areas (27) formed under the different arrangement condition to thereby detect the locations of the pattern areas (27), and driving means (8) for moving the stage (6) in such a direction that the relative deviation between the detected locations and the reference point (0') becomes a predetermined value.

In the present invention, when pattern areas are to be formed in advance on a substrate to be aligned relative to a reference point, marks or pattern areas providing the reference of alignment are provided and the relative deviation between the locations of the marks or pattern areas and said reference point is formed, and the substrate is moved in such a direction that said relative deviation becomes a predetermined value and therefore, even if a reference for alignment such as an orientation flat is not specially provided in the substrate, it becomes possible to align the substrate. Also, due to the absence of a cut-away in the substrate, the distortion or the like of the substrate by a step such as heat treatment can be minimized. Further, a substrate having no orientation flat or notch is effective in that the application irregularity of a photosensitive agent.

Further, if the arrangement of images formed on the substrate is made asymmetrical and this is utilized, it will become unnecessary to specially provide any mark for alignment and this will be efficient in terms of the space in which the areas of circuit patterns are arranged and throughput.

BRIEF DESCRIPTION OF THE DRAWINGS

FIGS. 12A and 12B are plan views showing the relation between fiducial marks attached to the wafer and a laser spot, in which FIG. 12A shows the case where the fiducial marks are attached to the surface of the wafer, while FIG. 12B shows the case where the fiducial marks are attached to the back surface of the wafer, respectively.

FIGS. 13A and 13B are lateral views showing a fiducial mark detection portion of the aligning apparatus according to the former of the above two embodiments of the present invention, in which FIG. 13A shows the state seen from the lengthwise direction of the laser spot, while FIG. 13B shows the state seen from the breadthwise direction of the laser spot.

FIGS. 14A and 14B are lateral views showing the fiducial mark detection portion of the aligning apparatus according to the latter of the above two embodiments of the present invention, in which FIG. 14A shows the state seen from the lengthwise direction of the laser spot, while FIG. 14B shows the state seen from the breadthwise direction of the laser spot.

FIG. 18A is an explanatory view showing a prealigning operation based on the outer form of the wafer by use of prealignment pins, while

FIGS. 20A and 20B are explanatory views showing an aligning apparatus according to still another embodiment of the present invention, in which FIG. 20A shows the case using two types of laser spots, while FIG. 20B shows the case using two kinds of fiducial marks, respectively.

DESCRIPTION OF THE PREFERRED EMBODIMENTS

Figure 1:
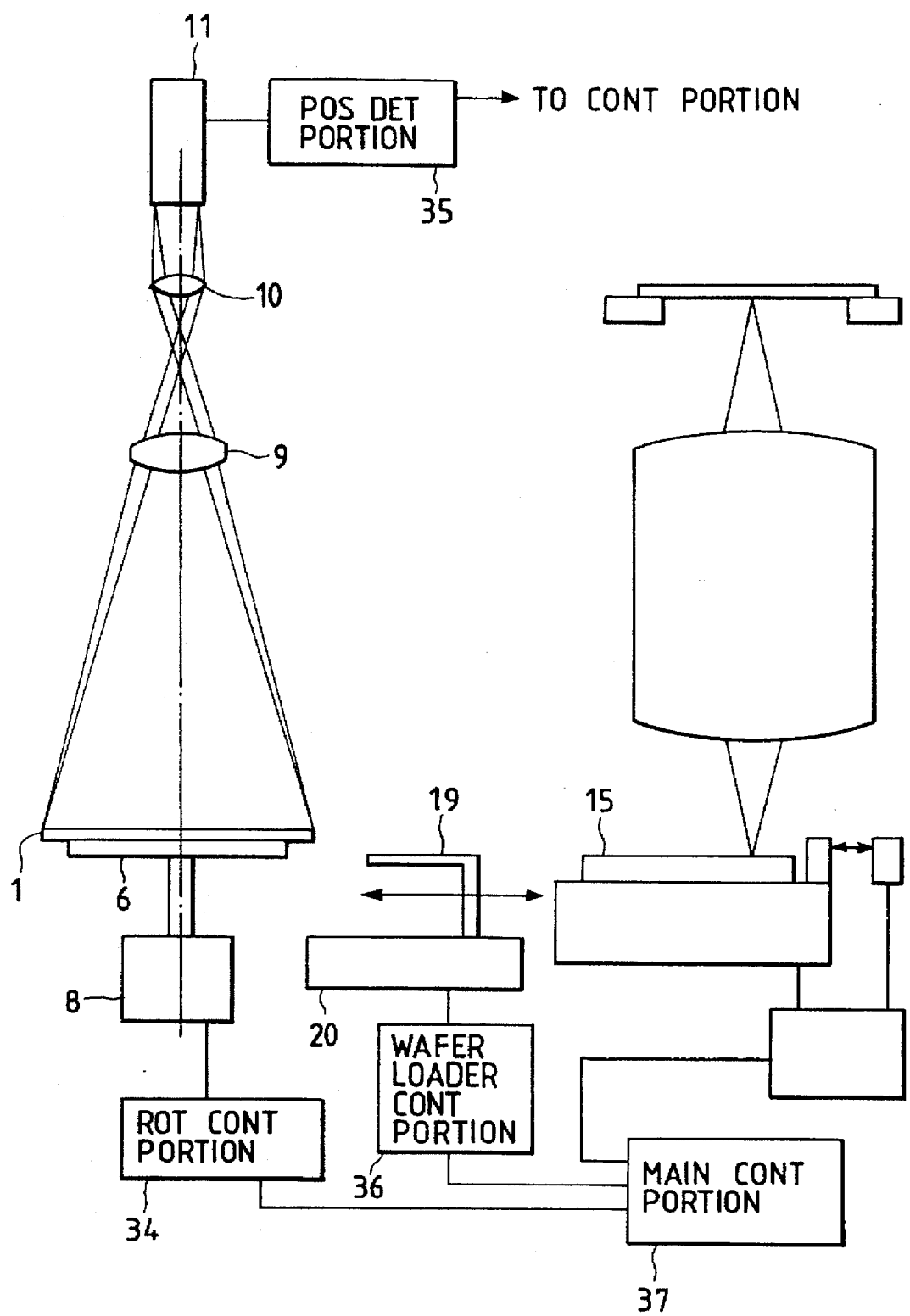
FIG. 1 schematically shows the construction of an aligning apparatus according to an embodiment of the present invention.
Figure 2:
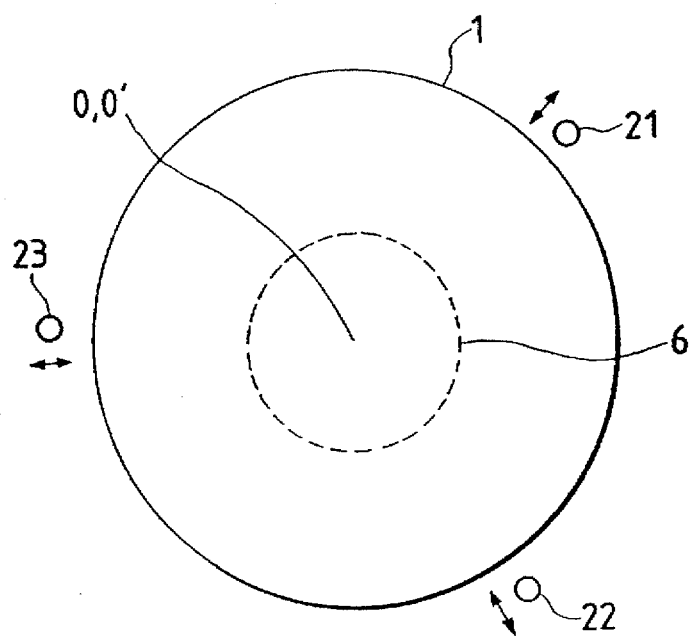
FIG. 2 shows the manner of centering a wafer by the use of three pins.
Figure 3:
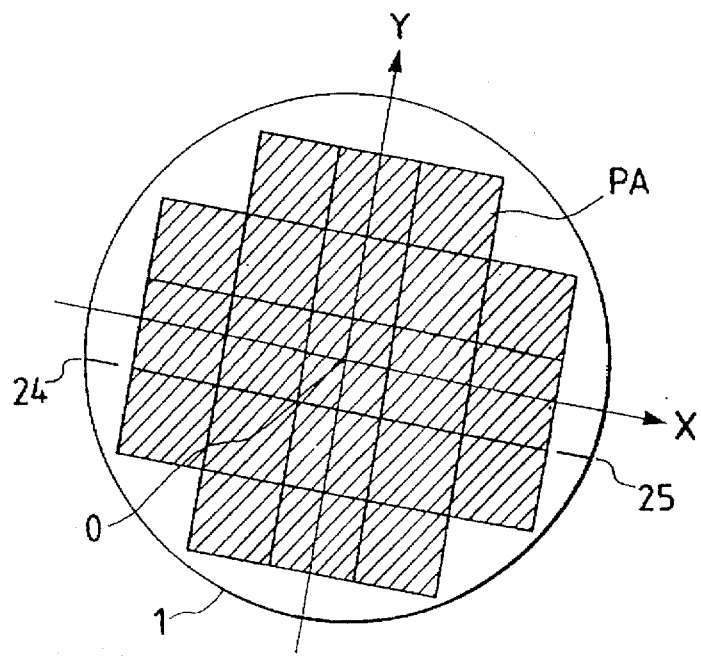
FIG. 3 shows the arrangement of circuit patterns on a wafer to be aligned.

FIG. 1 schematically shows an aligning apparatus according to an embodiment of the present invention. A wafer 1 is conveyed from a container case, not shown, onto a wafer holder 6 for prealignment, and is aligned so that the center 0 of wafer 1 may substantially coincide with the center (rotary shaft) 0' of the holder 6, by prealignment pins 21, 22 and 23 as shown in FIG. 2 being driven in the directions of arrows, and is held on the holder 6. At that time, minute offset (positional deviation in a two-dimensional direction) relative to a predetermined position to which the wafer 1 should be aligned and rotational deviation remain in the wafer 1. The holder 6 is journalled to a motor 8 and is rotatable by a rotation controlling portion 34. Further, a CCD 11 is disposed at a position conjugate with the surface of the wafer 1 with lenses 9 and 10 interposed between the CCD and the wafer, and the design is such that an output signal from the CCD 11 is two-dimensionally analyzed by a position detecting portion 35. If the CCD is one which observes the entire surface of the wafer at a time, the wafer will be observed as shown in FIG. 3 in an ITV camera or the like connected to the CCD 11. Circuit pattern areas PA are already transferred onto the wafer 1 shown in FIG. 3 in a predetermined arrangement, and when with the center 0 as the origin, the arrangement coordinates XY of the pattern areas PA are set, marks 24 and 25 for alignment are disposed at positions asymmetrical with respect to the X-axis (but line-symmetrical with respect to the Y-axis). These marks 24 and 25 are detected by the CCD 11, and the positions of the marks 24 and 25 relative to the center 0' are analyzed by the position detecting portion 35. As regards image information on the wafer 1 detected by the CCD, the two dimensional position of each of the picture elements of the CCD and information indicative of the presence or absence of an image at that position are stored in a memory in the position detecting portion 35 correspondingly to each other. It is therefore possible to choose any data from the detected image information and process the data. The location of the outer peripheral portion of the arrangement of the pattern areas PA is found on the basis of the positions of these marks to thereby find accurate rotational deviation (rotation angle) and offset. The wafer has its rotational deviation corrected by the rotation controlling portion 34 and is conveyed onto a wafer holder 15 by a wafer loader 19. The wafer loader 19 accurately conveys the wafer 1 onto the wafer holder 15 by a driving portion 20 and a wafer loader controlling portion 36. With regard to the offset, the amount of offset is transmitted from the position detecting portion 35 to a main control portion 37, and precise alignment during exposure is effected by the amount of offset being corrected on the wafer holder 15.

Figure 4:
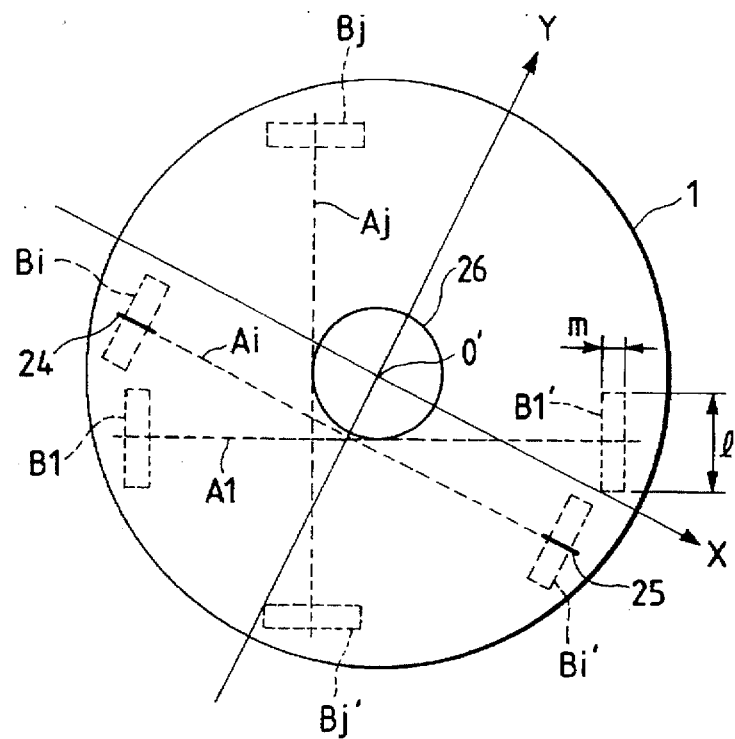
FIG. 4 shows a method of detecting image information on the wafer to be aligned.
Figure 5:
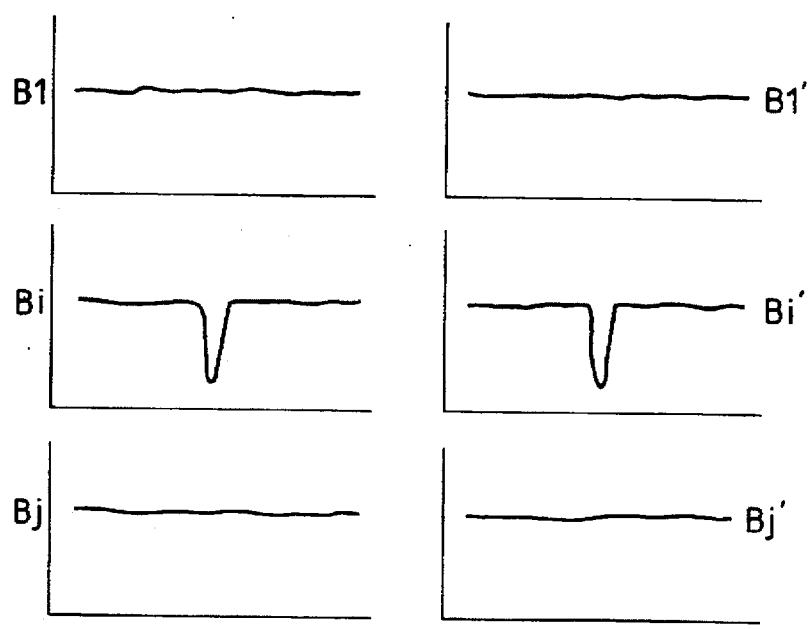
FIG. 5 shows the signals of the image information detected by the method shown in FIG. 4.

A method of detecting the marks 24 and 25 will now be described with reference to FIG. 4. This is to examine, on the basis of the design positions of the marks 24 and 25, at what positions the marks 24 and 25 exist relative to the center 0' of the holder. Incidentally, if the positions of the marks 24 and 25 relative to the center 0 of the wafer coincide with the positions of the marks 24 and 25 relative to the center 0' of the holder, the alignment of the wafer is completed. Supposing coordinates axes X and Y on the wafer 1 with the center 0 as the origin, the design positions of the marks 24 and 25 are represented by (−x, .y) and (x, .y), respectively. As described above, the marks 24 and 25 are at positions line-symmetrical with respect to the Y-axis and asymmetrical with respect to the X-axis. In this case, in the position detecting portion 35, a circle 26 is supposed at a distance of a radius |y| from the center 0' of the holder, and tangents An tangential to this circle 26 are set. On each of these tangents An, image information in areas Bn and Bn' near positions at distances ±x from each tangent point is analyzed. That is, data corresponding to m picture elements of the CCD in the lengthwise direction of the marks 24 and 25 are added together and defined as the data of one point, and the data is processed with respect to the range of one picture element in Y direction to thereby find the coordinates positions of the marks. Examples of signals obtained when the image information detected by the CCD is processed with respect to areas $B_1$, Bi, Bj and $B_r$, Bi', Bj' are shown in FIG. 5. In the areas $B_1$, Bj and $B_{1'}$, Bj', the marks 24 and 25 do not exist within the detection area and therefore, the waveforms of the signals become substantially flat, but in the areas Bi and Bi', the marks 24 and 25 exist within the detection area and therefore are detected as bottom signals.

The rotational deviation and the offset of the wafer in Y-direction can be found from the positions of the marks relative to the center 0' found by the above-described method and the design positions of the marks (the positions at which the marks exist relative to the center 0'). The suffix n in An and Bn is n>2πy/1, and further the number of picture elements m to which the data is added can be set so as to be smaller than the number of the picture elements of the marks 24 and 25 in the lengthwise direction thereof. The arrangement of the marks 24 and 25 is associated with the direction of the crystal lattice in the wafer and therefore, the marks are formed in advance before the pattern areas are formed on the wafer.

Figure 6A:
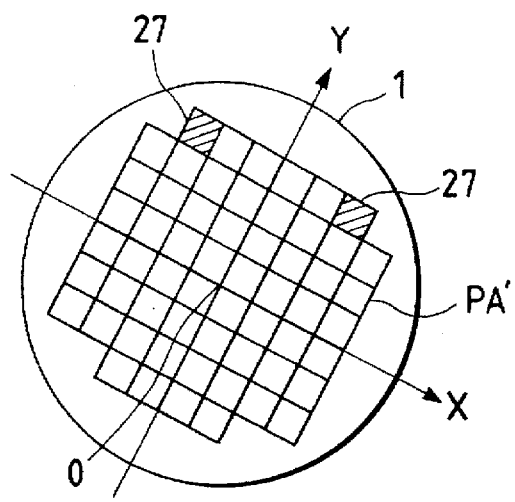
FIG. 6A shows another example of the arrangement of circuit patterns on the wafer to be aligned.
Figure 6B:
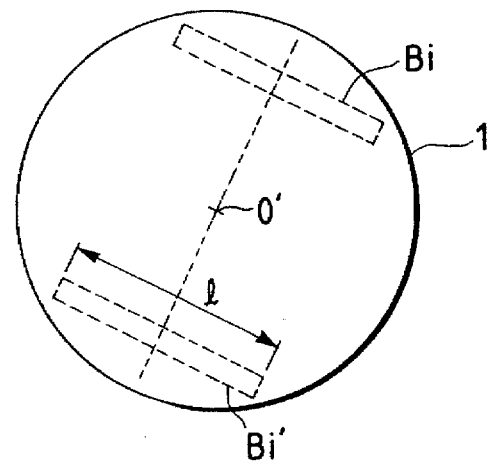
FIGS. 6B and 6C show other methods of detecting image information on the wafer to be aligned.
Figure 6C:
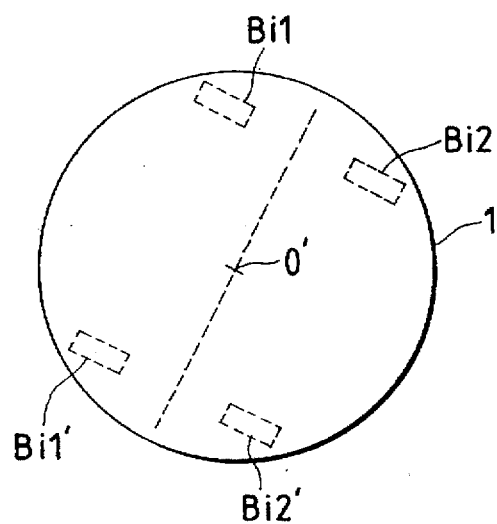
Figure 7A:
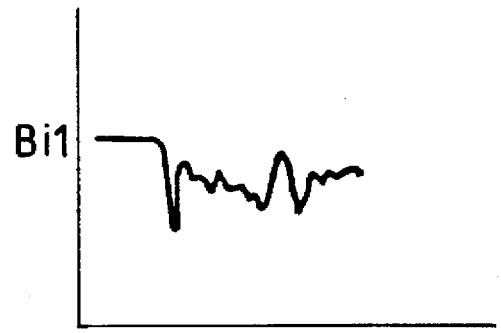
FIGS. 7A, 7B, 7C and 7D show the signals of the image information detected by the methods shown in FIG. 6.
Figure 7B:
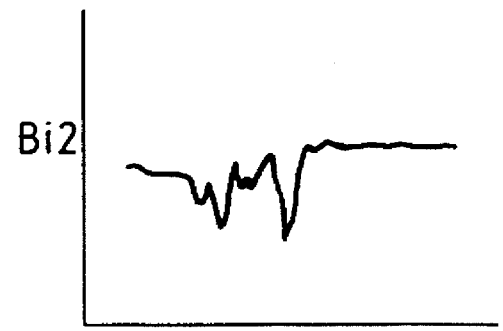
Figure 7C:
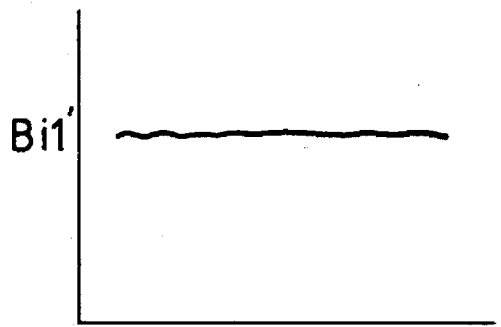
Figure 7D:
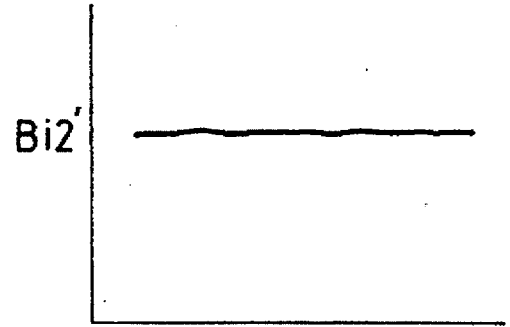

In the foregoing embodiment, a description has been give of a case where with the material directionality (the direction of the crystal lattice) of the wafer taken into account, alignment is effected by the use of marks for alignment other than the pattern areas arranged on the wafer. However, when there is not such a limitation, the marks 24 and 25 will become unnecessary if the arrangement itself of the pattern areas is made asymmetrical with respect to one particular coordinates axis of the arrangement coordinates. As shown, for example, in FIG. 6A, pattern areas 27 are provided so that the arrangement of the pattern areas may be asymmetrical with respect to the x-axis. In this case, it is not necessary to set the circle 26 as described above, but a straight line passing through the center 0' of the holder as shown in FIG. 6B is set on the wafer. With respect to the areas near the positions corresponding to the pattern areas 27 (particularly the outer peripheral portion) near the opposite ends of this straight line, the width of the detection range 1 for the aforementioned area Bn is made great, or as shown in FIG. 6C, the detection range 1 is divided into two respective areas Bi1, Bi2 and Bi1', Bi2', whereby the outer peripheral position of the asymmetrically arranged pattern areas 27 can be detected. Thereupon, when the areas 27 are detected, the waveforms of signals obtained with respect, for example, to the areas Bi1, Bi2 and Bi1', Bi2' become such as shown in FIGS. 7A–7D and thus, the locations of the pattern areas 27 can be found. The amount of rotational deviation and offset of the wafer can be found from the locations of the pattern areas 27 and the design positions of the pattern areas 27 (the positions at which the areas 27 should exist relative to the center 0'). Further, by averaging the positions of the straight line portions of the outer periphery of the patterns, it also becomes possible to know the outer peripheral position accurately. Also, in the above-described case, as shown in FIGS. 7A, 7B, 7C and 7D, a plurality of bottom signals come out of the pattern portion, but in a portion wherein no pattern exists, flat signals only come out and therefore, it can be recognized that the outer peripheral portion is the positions of the bottom signals at the opposite ends of the waveform.

Further, there has been adopted a construction in which the entire area is observed by the utilization of a CCD to detect the image on the wafer, but alternatively, the design may be such that a line sensor or the like is utilized to observe a partial area on the wafer and the wafer is sequentially rotated by a predetermined angle and the observation area is sequentially moved, whereby substantially the entire area is observed.

Figure 10:
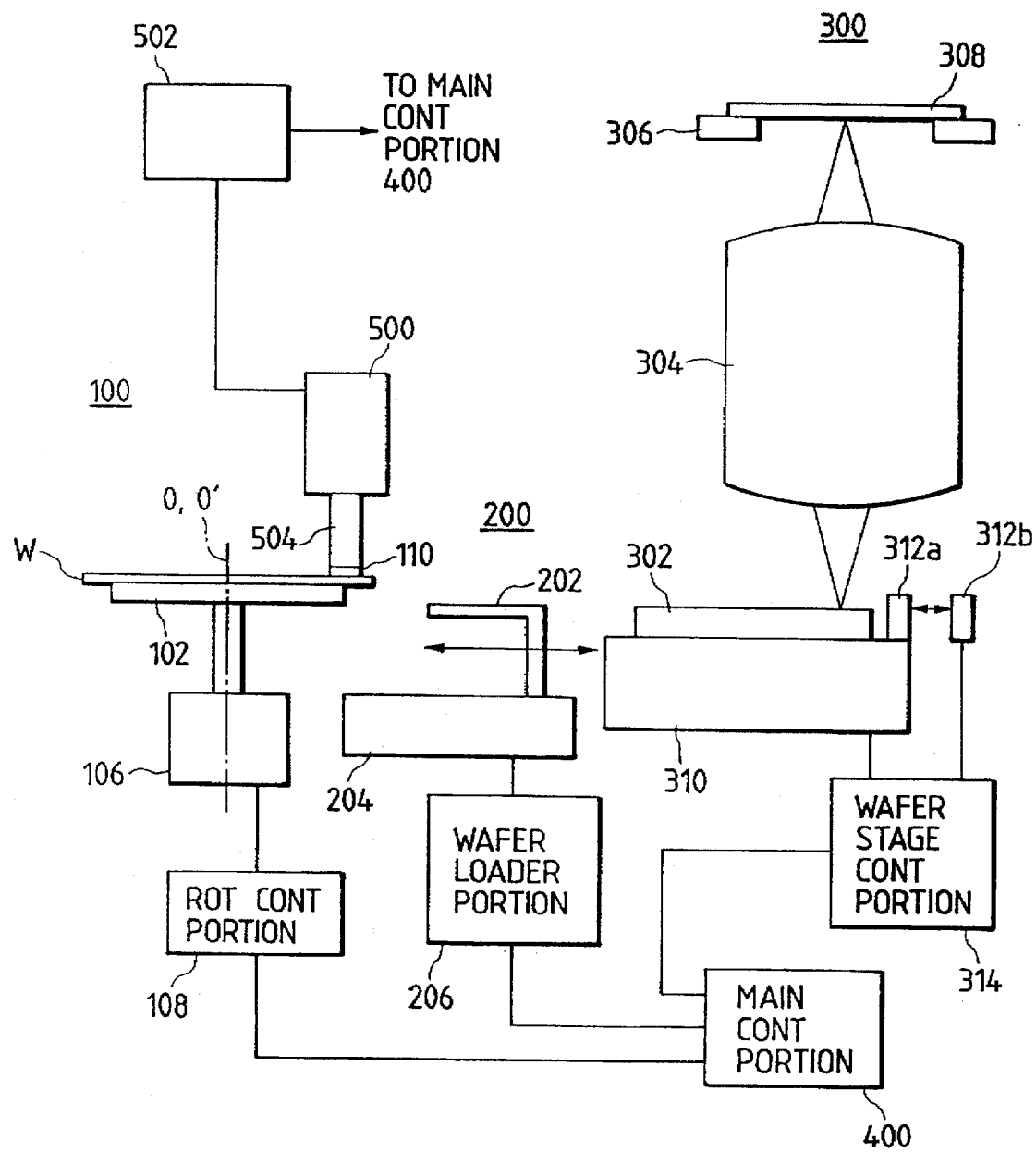
FIG. 10 schematically shows the construction of an exposure system provided with the aligning apparatus according to another embodiment of the present invention.

FIG. 10 is a diagram schematically showing the construction of a system in which the aligning apparatus according to the present invention is combined with an exposure apparatus. As shown in FIG. 10, this system is mainly comprised of an aligning apparatus 100 for effecting pre-alignment according to the present invention, a wafer conveying apparatus 200, and an exposure apparatus 300. Each of these apparatuses can be systematically controlled by a main control portion 400.

Figure 18A:
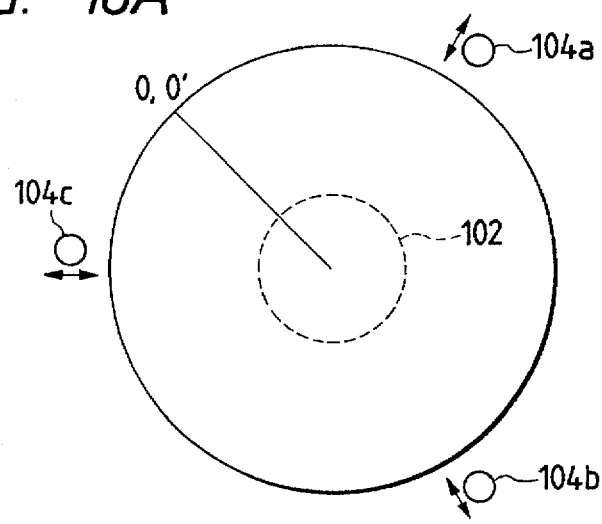
Figure 18B:
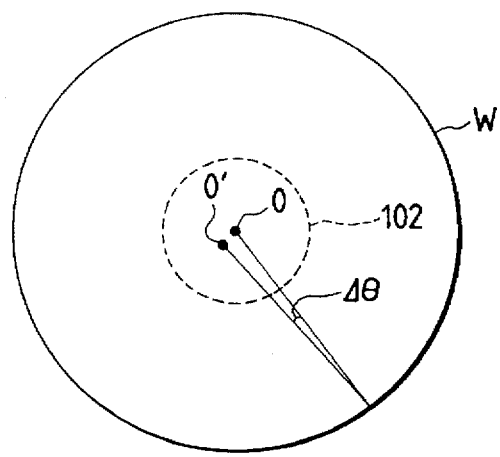
FIG. 18B is an explanatory view showing a deviation between the center of the wafer and the center of rotation after the prealignment.

First, a description will be given of the schematic construction of the aligning apparatus 100 for prealignment according to the present invention. This aligning apparatus 100 is provided with a wafer holder 102 for prealignment on which a wafer W is placed and fixed, and a rotating mechanism such as a motor 106 for rotatably supporting this wafer holder 102. An operation of this rotating mechanism 106 is controlled through a rotation controlling portion 108 in accordance with a command from the main control portion 400. Note that a position metering apparatus (not shown) such as a rotary encoder is provided on the rotating mechanism or the wafer holder 102 so that it is possible to meter an amount of rotation (a rotation angle) of the wafer W. On the peripheral portion of the wafer holder 102, prealignment pins 104a, 104b and 104c are arranged substantially concentrically, as shown in FIG. 18A. By driving these prealignment pins 104a, 104b and 104c in the radial direction (in the direction of arrow in the figure), the center 0 of the wafer W and the center 0' of the wafer holder 102 (the center of rotation) are aligned and maintained to be substantially coincide with each other. At that time, as shown in FIG. 18B, minute offset (positional deviation in a two-dimensional direction) relative to a predetermined position to which the wafer W should be aligned and rotational deviation remain in the wafer W.

Figure 15:
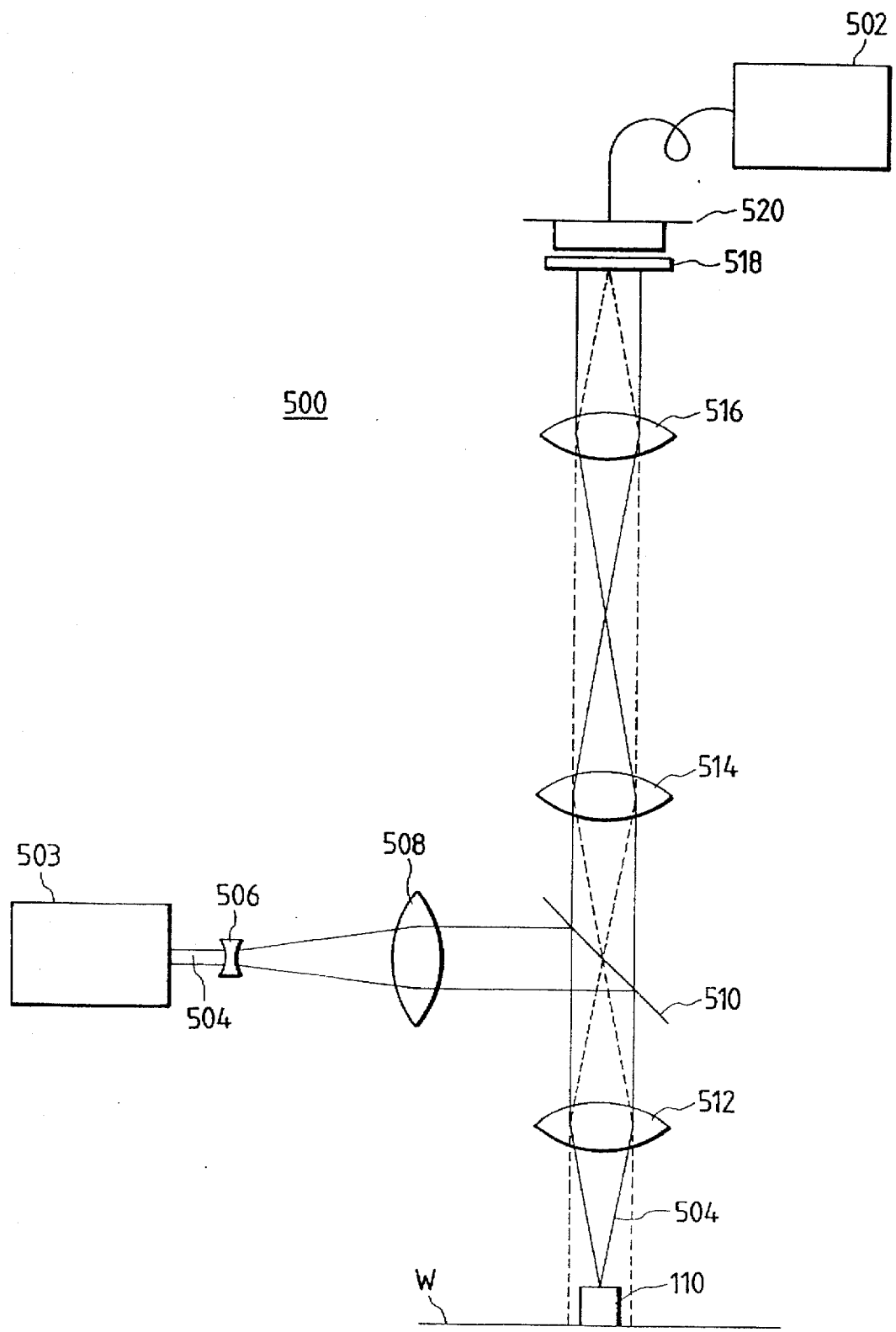
FIG. 15 schematically shows the construction of an alignment optical system applicable to the aligning apparatus according to the present invention.

An alignment optical system 500 is arranged above the wafer W (the wafer holder 102). As shown in FIG. 15, this alignment optical system 500 is provided with light irradiation portions (503, 506, 508, 510 and 512) and light receiving portions (512, 510, 514, 516, 518 and 520). A fiducial mark 110 which is described later is attached to the outer peripheral portion of the surface of the wafer W. This fiducial mark 110 is irradiated by illumination light 504 from the light irradiation portions (503, 506, 508, 510 and 512) of the alignment optical system 500, and the light 522 diffracted by said fiducial mark 110 is detected by the light receiving portions (512, 510, 514, 516, 518 and 520).

FIG. 15 shows the typical construction of the alignment optical system 500, seen from the lengthwise direction of a laser spot 504. Referring to FIG. 15, solid lines indicate an expansion of the laser beam, and broken lines a conjugate relation thereof. The alignment optical system 500 is provided with a laser source 503. Laser beam 504 emitted from this laser source 503 is expanded by beam expanders 506 and 508, deflected by a half mirror 510, and then converged by a cylindrical lens 512 so as to irradiate the surface of the wafer W (fiducial mark 110). The light beam reflected on the surface of the wafer W (the fiducial mark 110), after passing through the cylindrical lens 512 and the half mirror 510, reaches an aperture 518 by use of relay lenses 514 and 516. Then, it is arranged that only the diffracted or scattered light beam which is selected by the aperture 518 can reach a light receiving device 520.

On the other hand, the main control portion 400 (FIG. 10) outputs a sync signal to a control portion 502 of the alignment optical system 500 synchronously with a signal indicative of a rotation angle of the wafer W (the wafer holder 102) which is output from the rotation controlling portion 108. Then, the control portion 502 of the alignment optical system 500 is arranged to take in the diffracted or scattered light beam received by the light receiving device 520 in response to this sync signal.

Next, a brief description will be given of the construction of the wafer conveying mechanism 200 which is provided adjacent to the above-mentioned aligning apparatus 100. The wafer conveying apparatus 200 shown in the figure is mainly comprised of a wafer conveying arm 202 for conveying the wafer W, a loader driving portion 204 for driving the wafer convey arm 202, and a wafer loader controlling portion 206. It is possible to mount the wafer W which was prealigned by the aligning apparatus 100 on the wafer holder 302 of the exposure apparatus 300 with high precision in response to the command from the main control portion 400.

The exposure apparatus 300 shown in the figure is provided with a projection optical system 304, and is capable of effecting projection-exposure of a circuit pattern which is formed on a reticle or a mask placed on a reticle stage 306 onto the wafer W placed on the wafer holder 302 via the projection optical system 304. The wafer holder 302 is placed on a wafer stage 310, and is capable of effecting alignment in X, Y and θ directions with high precision. Note that laser interferometers 312a and 312b are capable of detecting the position of the wafer stage 310 with high precision. A wafer stage controlling portion 314 is capable of aligning the wafer stage 310 with precision by use of an unrepresented driving device, upon receiving an output from the laser interferometer 312b.

Figure 11:
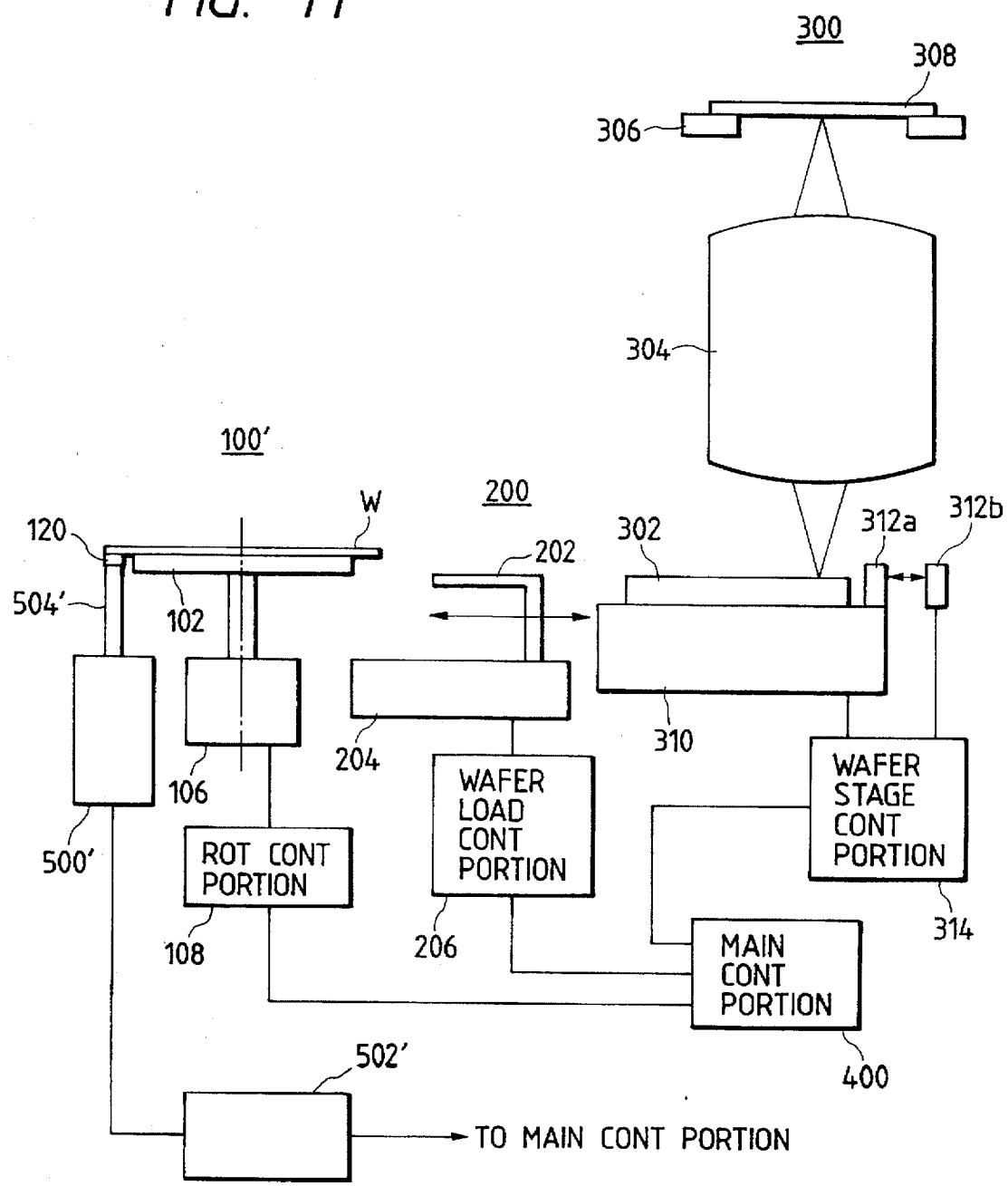
FIG. 11 schematically shows the construction of an exposure system provided with the aligning apparatus according to still another embodiment of the present invention.
Figure 12A:
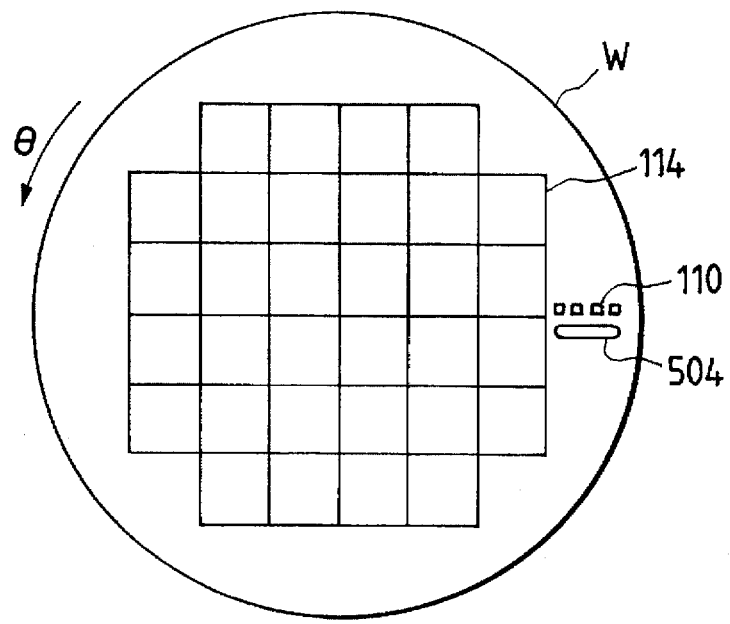
Figure 12B:
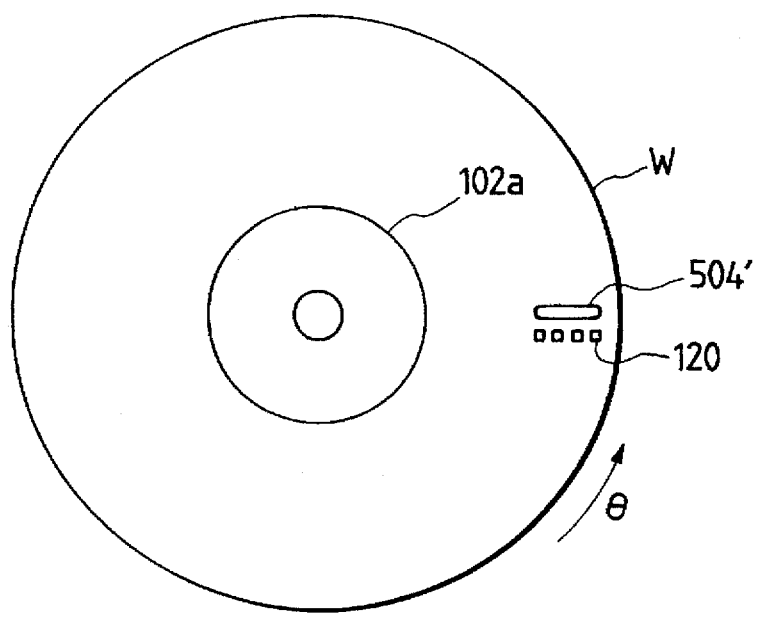

Though the aligning apparatus 100 provided with the alignment optical system 500 for detecting the fiducial mark 110 attached to the front surface of the wafer W, as shown in FIG. 12A, was shown in FIG. 10, the present invention is not limited to such embodiment. The apparatus according to the present invention can also be arranged to detect a fiducial mark 120 attached to the back surface of the wafer W, as shown in FIG. 12B. In this case, as shown in FIG. 11, an alignment optical system 500' is provided below the wafer W, the fiducial mark 120 is detected by a laser beam 504', and a rotation angle of the wafer W is detected by a control portion 502'. Note that the basic construction of the apparatus shown in FIG. 11 is substantially the same as that of the apparatus shown in FIG. 10 so that the components having the same functions as those shown in FIG. 10 are given the same reference numbers, and description thereof will not be repeated.

Next, arrangement of the fiducial marks 110 and 120 formed on the front surface or the back surface of the wafer W will be described with reference to FIGS. 12A and 12B.

FIG. 12A shows the case in which the fiducial mark 110 is attached to the front surface of the wafer W. This fiducial mark 110 is arranged in the form of a grating in the lengthwise direction of a laser illumination spot 504 which is irradiated by the laser alignment optical system 500. This fiducial mark 110 is provided outside the area 114 in which a circuit pattern is formed, and has the size to allow the laser spot 504 from the alignment optical system 500 to cross the fiducial mark 110 when the wafer W is rotated with the precision aligned by said prealignment pins 104a to 104c. Then, the fiducial mark 110 shown in FIG. 12A is used in a manner corresponding to the aligning apparatus shown in FIG. 1. On the other hand, FIG. 12B shows the case in which the fiducial mark 120 is attached to the back surface of the wafer W. This fiducial mark 120 is provided at a position which does not interfere with a wafer vacuum portion 102a by the wafer holder 102. The same condition as that shown in FIG. 12A is required with respect to the size of the fiducial mark 120. That is, the fiducial mark 120 has the size to allow the laser spot 504' from the alignment optical system 500' to cross the fiducial mark 120. Then, the fiducial mark 120 shown in FIG. 12B is used in a manner corresponding to the aligning apparatus 100' shown in FIG. 11.

Figure 13A:
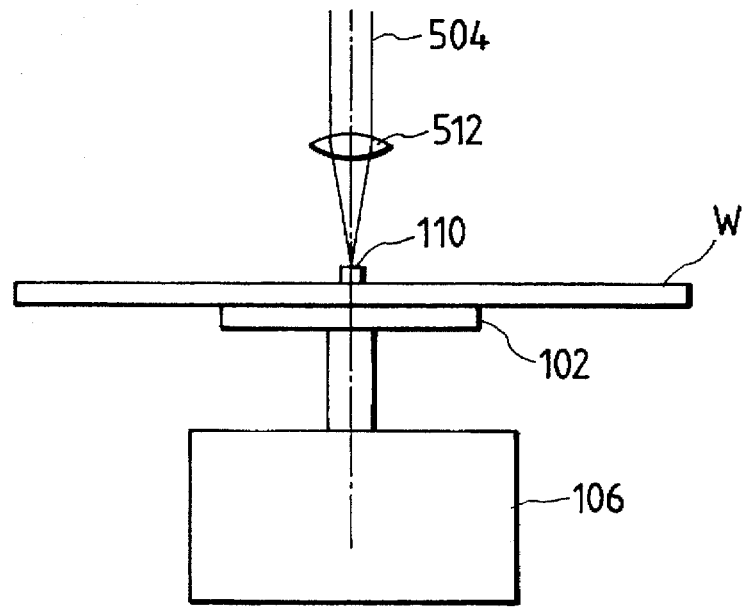
Figure 13B:
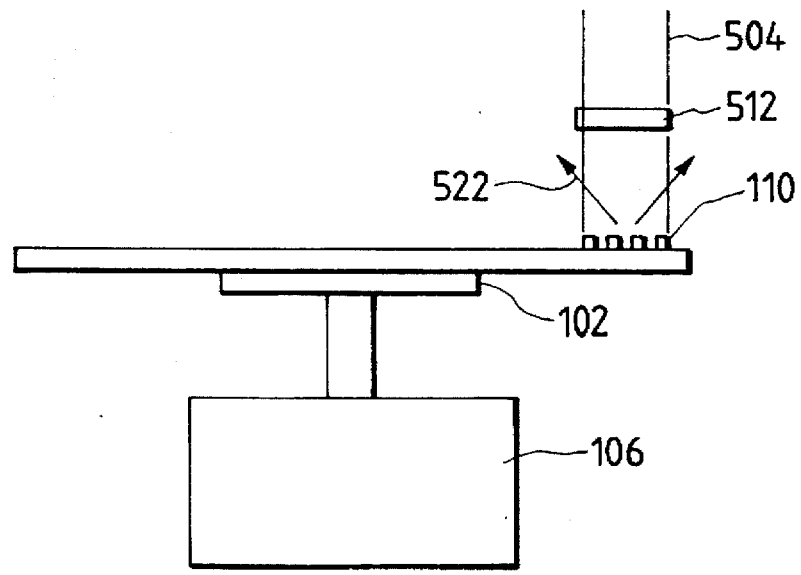
Figure 19:
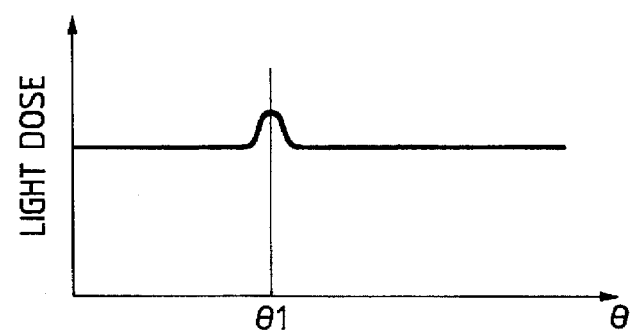
FIG. 19 is a graph showing waveform information obtained synchronously with a wafer rotation angle.

FIGS. 13A and 13B show the state in which the laser spot 504 is applied to the fiducial mark 110 (FIG. 12A) attached to the front surface of the wafer W in the apparatus 100 shown in FIG. 10. Note that FIG. 13A is a lateral view seen from the lengthwise direction of the laser spot 504, while FIG. 13B is a lateral view seen from the breadthwise direction of the laser spot 504. A lens 512 is a cylindrical lens, and the laser spot 504 is converged in the breadthwise direction to become a parallel beam in the lengthwise direction. While such laser spot 504 is applied, the wafer W is rotated by a rotation angle θ from an arbitrary position by use of a motor 106, as indicated by the arrow in FIG. 12A, and the diffracted light 522 is received. In this manner, the relation between the intensity of the diffracted light and the rotation angle θ as shown in FIG. 19 can be obtained.

Figure 14A:
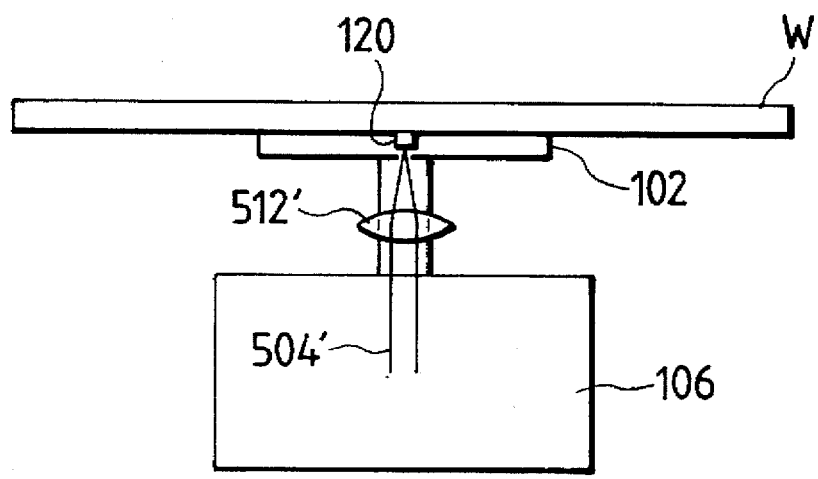
Figure 14B:
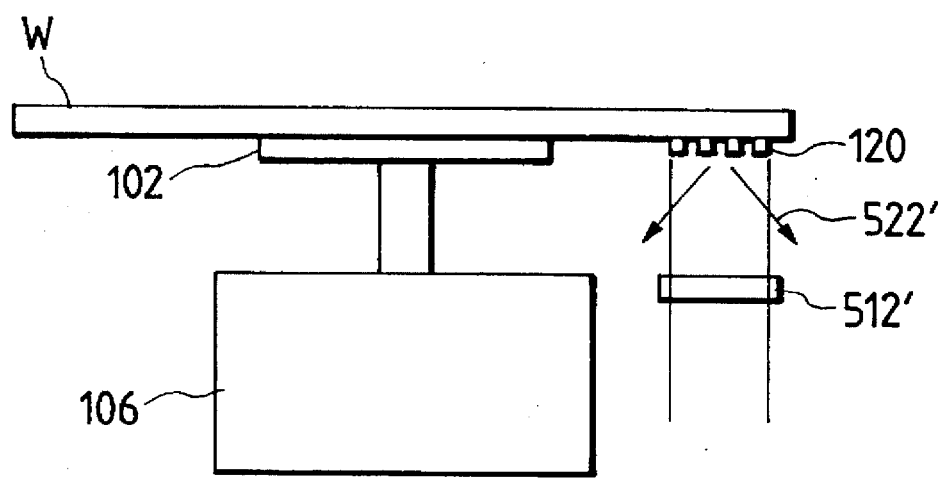

FIGS. 14A and 14B show an arrangement for receiving diffracted light 522' by applying the laser spot 504' to the fiducial mark 120 (FIG. 12B) attached to the back surface of the wafer W in the apparatus 100' shown in FIG. 11. Note that FIG. 14A is a lateral view seen from the lengthwise direction of the laser spot 504', while FIG. 14B is a lateral view seen from the breadthwise direction of the laser spot 504'. Also with this arrangement, it is possible to obtain the rotation angle θ of the wafer W by monitoring the distribution of intensity of the diffracted light 522' reflected on the back surface of the wafer W. However, the basic construction of the apparatus shown in FIGS. 14A and 14B is substantially the same as that of the apparatus shown in FIGS. 13A and 13B so that out of the components shown in FIGS. 14A and 14B, the components having the same functions as those shown in FIGS. 13A and 13B are given the same reference numbers, and description thereof will not be repeated.

Next, an operation of the system shown in FIG. 10 will be schematically described in the following.

Figure 8A:
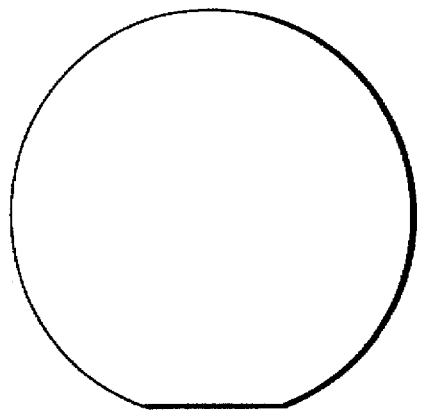
FIGS. 8A and 8B show the shapes of substrates adapted for an aligning apparatus according to the prior art.
Figure 8B:
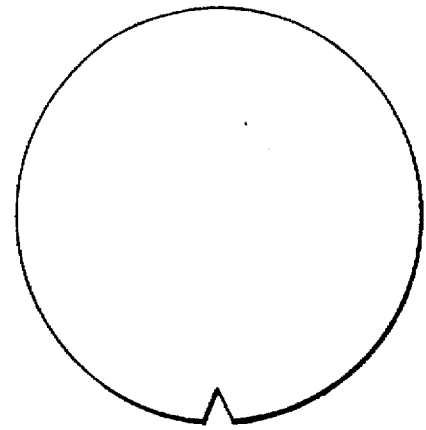
Figure 8C:
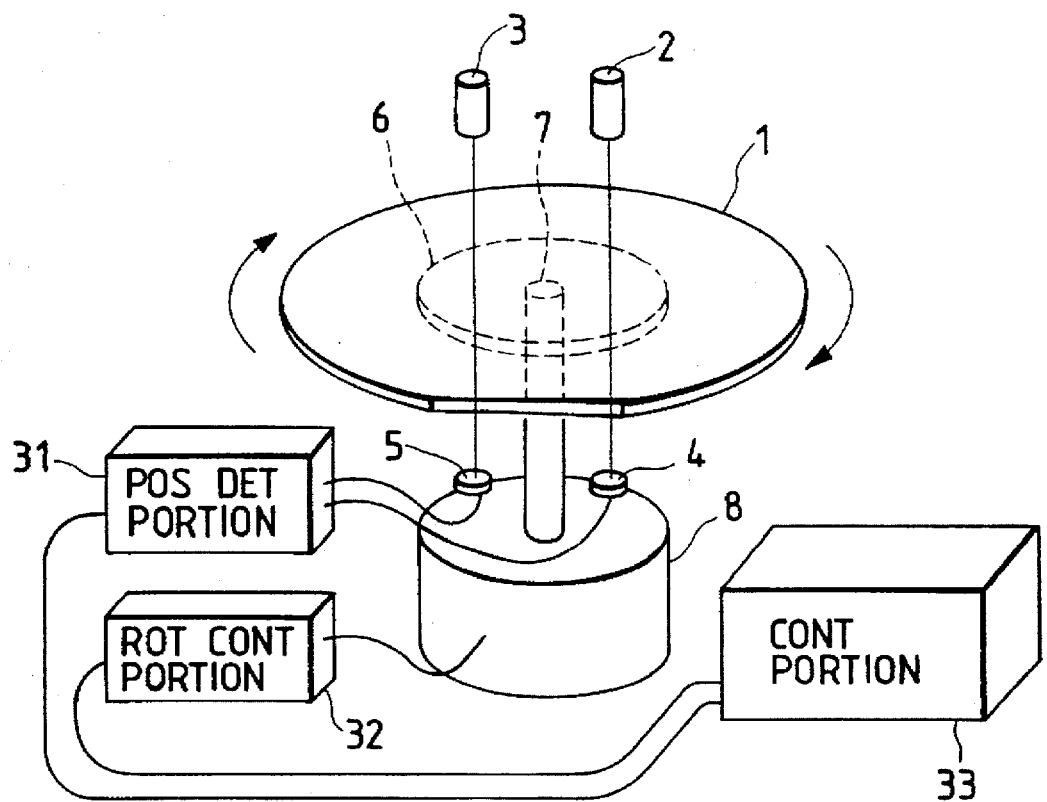
FIG. 8C schematically shows the construction of the aligning apparatus according to the prior art.
Figure 9A:
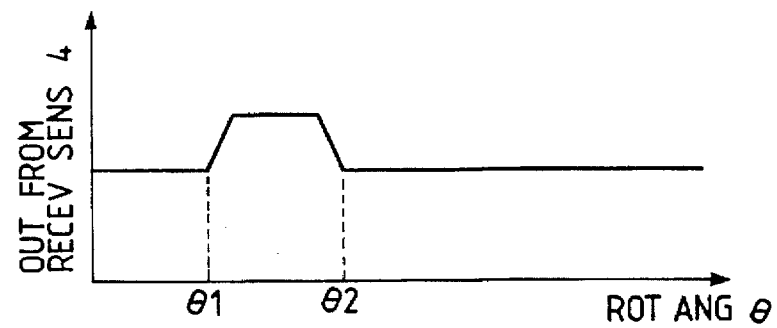
FIGS. 9A to 9C show the relation between the rotation angle of a wafer and the outputs of detected signals when use is made of the aligning apparatus according to the prior art.
Figure 9B:
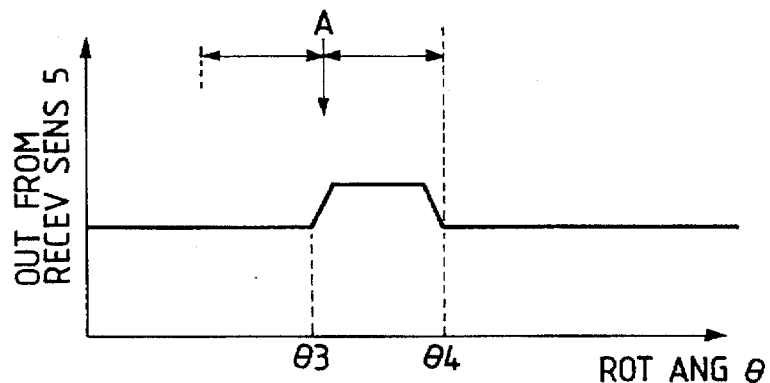
Figure 9C:
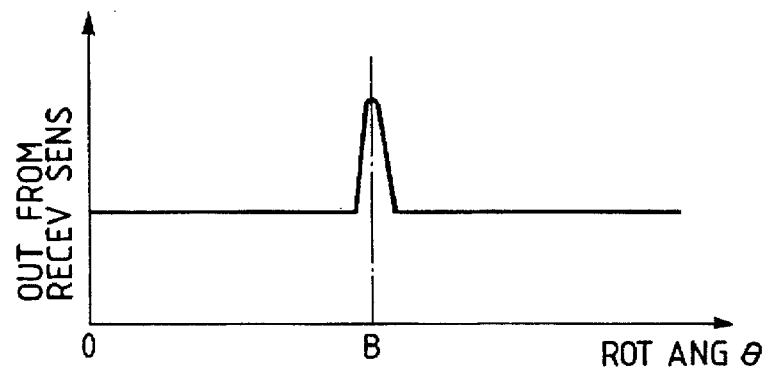

First, the wafer W is taken out from an unrepresented housing case and is placed on the wafer holder 102, and then prealignment is effected by the prealignment pins 104a, 104b and 104c. Note that though a description will be given of an alignment system of a contact type here, the position in X- and Y-directions may be obtained by the system of detecting an outer diameter position of the wafer W in a non-contact manner by photoelectric detection, as shown in FIG. 8C. Next, the laser source 503 (FIG. 15) is activated to emit the laser beam 504. The emitted laser beam 504, after being expanded by the beam expanders 506 and 508, is deflected in the direction of the wafer W by the half mirror 510, and converged by the cylindrical lens 512 so as to irradiate the surface of the wafer W (the fiducial mark 110).

Figure 16:
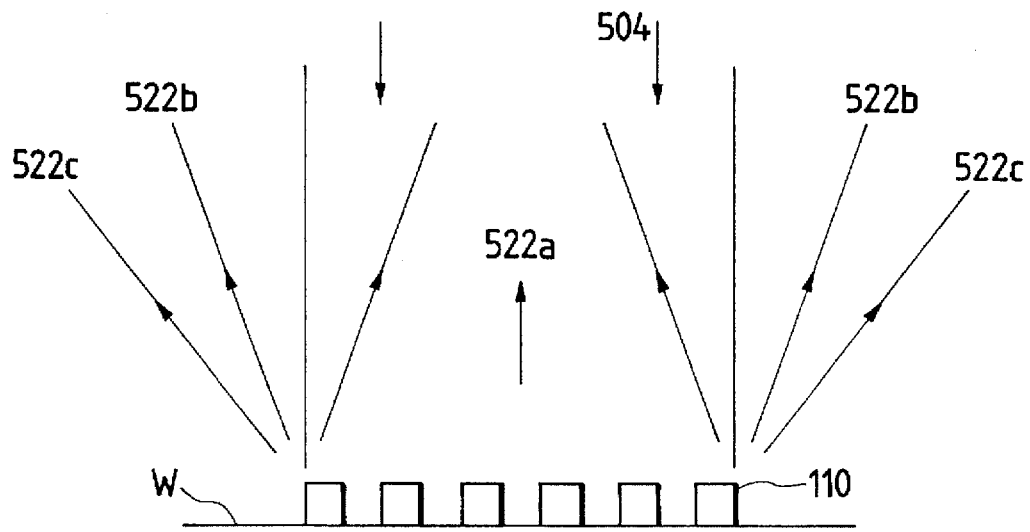
FIG. 16 shows the state of diffracted light beams from the fiducial marks formed on the surface of the wafer.

FIG. 16 shows the state in which the surface of the wafer W is irradiated by the laser beam 504 in this way, in an enlarged manner. FIG. 16 shows the fiducial mark 110 seen from a direction perpendicular to the direction of a field of view in FIG. 15, that is, the breadthwise direction of the laser beam. As shown in FIG. 16, the parallel laser beam 504 is applied to the fiducial mark 110 arranged in the form of a grating with predetermined spaces, so that light beams from the fiducial marks 110 in the form of a grating is constituted by diffracted light dispersed as 0th-order diffracted light 522a, ±first-order diffracted light 522b, ±second-order diffracted light 522c, and the like.

Figure 17:
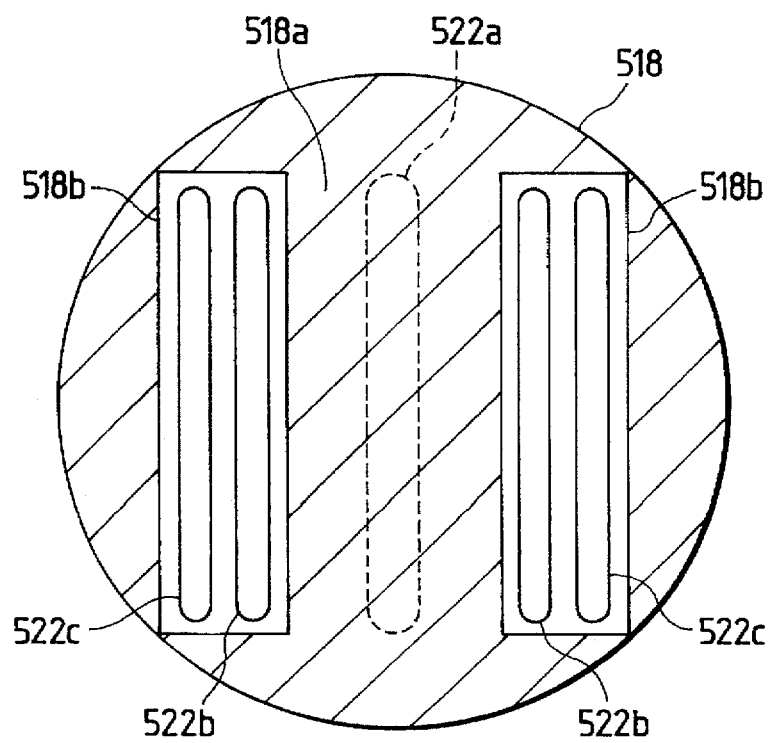
FIG. 17 is a schematic plan view showing an opened state of an aperture provided in the alignment optical system.

A description will be given again with reference to FIG. 15. The diffracted light beams 522a, 522b and 522c from the surface of the wafer W (the fiducial mark 110) pass through the cylindrical lens 512 and the half mirror 510 for the second time, and then reach the aperture 518 by use of the relay lenses 514 and 516. The aperture 518 is arranged to be corresponding to the position of the pupil, has a light-shielding belt 518a at the central portion thereof, as shown in FIG. 17, and is equipped with opening portions 518b on both sides thereof. Therefore, among the diffracted light beams reaching the aperture 518, the 0th-order diffracted light 522a is intercepted by the light-shielding belt 518a positioned at the central portion so that only the ±first-order diffracted light 522b and the ±second-order diffracted light 522c can pass through the opening portions 518b and reach the light receiving device 520.

With such structure, when the wafer W is rotated, an analog signal from the light receiving device 520 is converted into a digital signal by a controller 502 of the alignment optical system 500 synchronously with the rotation angle θ thereof and is stored in a memory. A waveform signal obtained at that time is shown in FIG. 19. An output signal θ1 shown in FIG. 19 indicates that the mark 110 passes through the laser spot 504 when the wafer W is rotated from the ground (zero-angle position) by θ1. The wafer rotation controlling portion 108 determines a wafer angle in accordance with the angle of θ1 and rotates the wafer W in accordance with this wafer angle. Then, at a position at which the wafer is to be delivered, the wafer W is delivered to wafer conveying arm 202, whereupon the prealignment is completed.

Furthermore, the wafer conveying arm 202 is driven by a loader driving portion 204 so as to mount the wafer W onto a wafer stage 302 of the exposure apparatus 300. Then, the exposure apparatus 300, while positioning the wafer W with precision, prints a circuit pattern on the exposure surface thereof. In this manner, according to the present invention, even with a wafer W having neither orientation flat nor notch, the prealignment can be effected with high precision and such wafer W can be delivered to the exposure apparatus 300. An operation of the aligning apparatus 100 according to the present invention has been described in the above with reference to the system shown in FIG. 10. However, it is clearly possible to operate the system shown in FIG. 11 in substantially the same manner as the system shown in FIG. 10.

In the above-mentioned structure, as shown in FIG. 18A, after the wafer W is placed on the wafer holder 102, the prealignment is effected by use of the prealignment pins 104a, 104b and 104c. Specifically, a virtual wafer center (0) is detected on the basis of the periphery of the wafer W to which the prealignment pins 104a, 104b and 104c are tangential. For this reason, there may be generated a deviation (the rotational error Δθ) between the center (0) of the wafer W and the center of rotation (0') only by an error in the periphery of the wafer (for example, 50 μm or around), as shown in FIG. 18B. However, if only one fiducial mark 110 or 120 is detected, as shown in FIGS. 12A and 12B, the rotation error Δθ can not be recognized so that it is feared that the alignment may become incorrect to that extent.

Figure 20A:
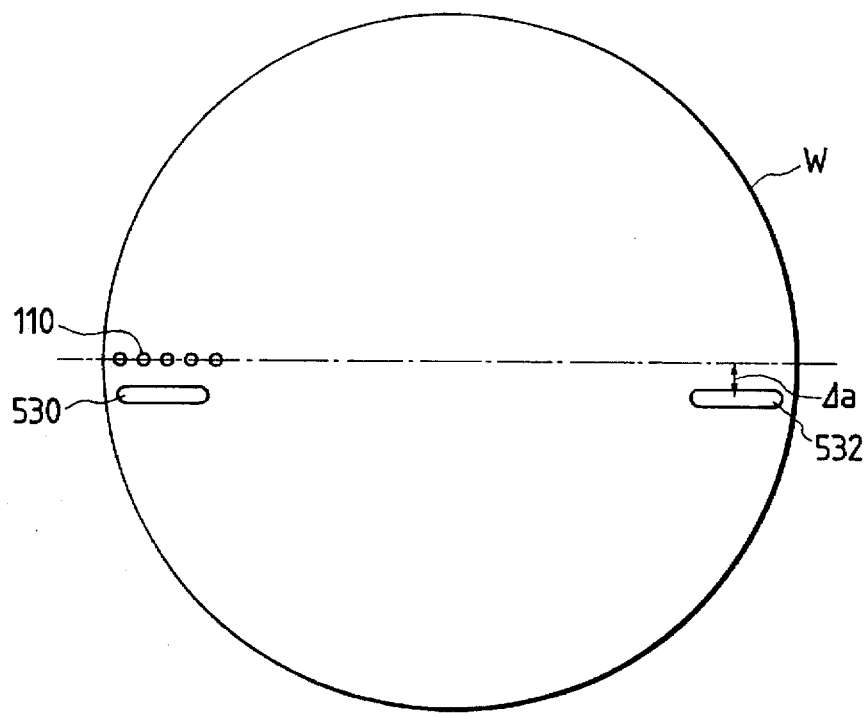

Then, according to another embodiment of the present invention, it is possible to provide two types of alignment optical systems, as shown in FIG. 20A, so as to detect diffracted light beams from the fiducial mark 110 by use of the two laser spots 530 and 532 which are separated from each other by 180° or around 180°. With such a structure, if the center 0 of the wafer deviates from the center 0' of rotation by ΔY in Y-direction, the angle detected by the laser spots 530 and 532 varies only by 2×arcsin (ΔY/Y). Also, the rotation error Δθ can be recognized as a value which is obtained by correcting the detected rotational angle θ with arcsin (ΔY/Y). Therefore, according to the present embodiment, it becomes possible to correctly recognize the deviation ΔY in Y-direction and the rotational error Δθ, whereby alignment with higher precision can be effected. Note that, in the present embodiment, in order to make the top and bottom of the wafer W recognizable, it is required to deviate the detected position of the laser spots 530 and 532 from the diameter only by Δa, as shown in FIG. 20A, or to arrange the mark asymmetrically.

Figure 20B:
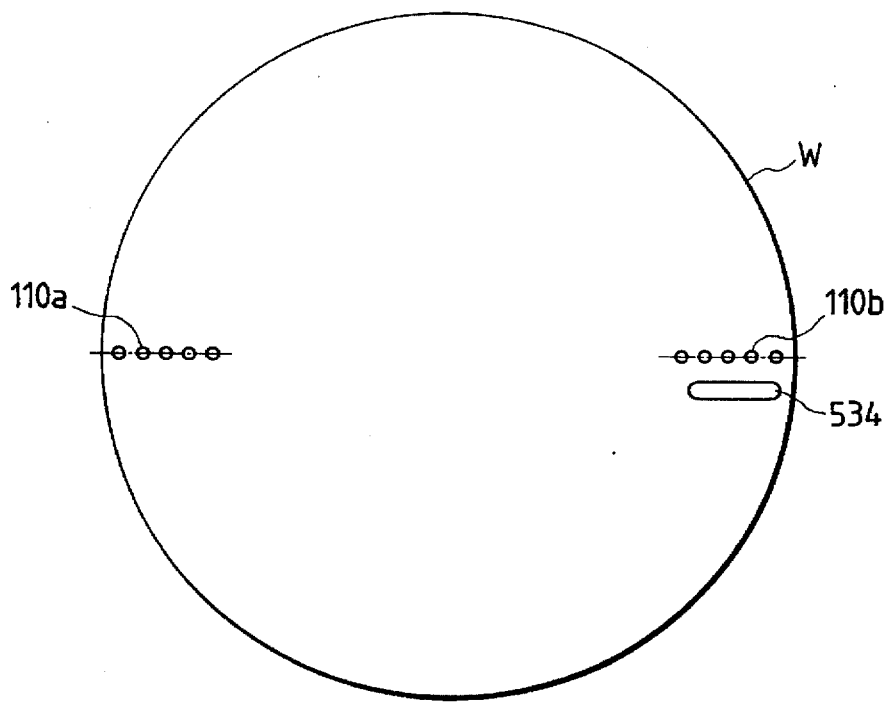

Also, the same effect as in FIG. 20A can be obtained with the construction in which the two fiducial marks 110a and 110b are arranged 180° apart, for example, and these fiducial marks 110a and 110b are to be detected by the single laser spot light 534 as shown in FIG. 20B. In this case also, if the center (0) of the wafer deviates from the center (0') of rotation in Y-direction only by Δθ, the angle detected by the fiducial marks 110a and 110b varies only by 2×arcsin (ΔY/Y). It is also possible to recognize the detected rotational error Δθ as the value which is obtained by correcting the detected rotational angle θ with arcsin (ΔY/Y). Therefore, also with this construction, it is possible to correctly recognize the deviation ΔY in Y-direction and the rotational error Δθ, whereby alignment with higher precision can be effected. Note that, in the present embodiment, in order to make the top and bottom of the wafer W recognizable, it is required to arrange the fiducial marks to be individually recognizable, as by changing the shapes of the fiducial marks 110a and 110b and the multi-mark pitch.

In the above description, the aligning apparatus according to the present invention has been explained by the illustrated embodiments. However, the present invention is not limited to these embodiments, and allows various kinds of modifications and alterations within the scope of the claims. For example, in the foregoing embodiments, grating-like patterns as shown in FIGS. 12A and 12B are used as the fiducial marks and diffracted light beams from these fiducial marks are received by the light receiving device 520 via the aperture 518. However, the present invention is not limited to such arrangement. It is possible to employ the construction in which bar-like patterns are used as fiducial marks so as to detect scattered light from the edge portions thereof. Or, it is possible to arrange to detect a convergent spot such as a Fresnel pattern.

What is claimed is:

1. A method of aligning a circular substrate with predetermined direction, whereby the circular substrate is prealigned relative to a first stage, comprising the steps of:

setting said circular substrate on a second stage, which rotates with respect to a center of rotation thereof, such that the center of said substrate substantially coincides with said center of rotation;

detecting positions of a pair of marks which are formed on a peripheral portion of said circular substrate, said detecting including rotating said second stage;

rotating said second stage so as to align said circular substrate with said predetermined direction in accordance with the detected positions of said pair of marks; and moving the aligned circular substrate from said second stage to said first stage.

2. A method of aligning a circular substrate according to claim 1, wherein said marks are formed asymmetrically with respect to at least one axis of a coordinate system having an origin at the center of said circular substrate.

3. A method of aligning a circular substrate with predetermined direction, whereby the circular substrate is prealigned relative to a first stage, comprising the steps of:

forming a pair of marks on said circular substrate that are asymmetrical with respect to at least one axis of a coordinate system having an origin at the center of said circular substrate;

setting said circular substrate on a second stage different from said first stage;

forming a two-dimensional image of said circular substrate on said second stage;

detecting, from said image, positions of said pair of marks;

rotating said circular substrate so as to align said circular substrate with said predetermined direction in accordance with the detected positions of said pair of marks; and moving the aligned circular substrate from said second stage to said first stage.

4. A method of aligning a circular substrate according to claim 3, wherein said pair of marks have a pair of patterns.

5. A method of aligning a circular substrate with predetermined direction, whereby the circular substrate is prealigned relative to a first stage, comprising the steps of:

setting said circular substrate on a second stage different from said first stage;

radiating detecting light to a peripheral portion of said circular substrate set on said second stage;

detecting a position of a mark which is formed on the peripheral portion of said circular substrate, said detecting including relatively moving said detecting light and said circular substrate;

aligning said circular substrate with a predetermined direction in accordance with the detected position of said mark; and moving the aligned circular substrate from said second stage to said first stage.

6. A method of aligning a circular substrate according to claim 5, wherein said detecting light includes a laser beam, said mark includes a diffraction mark or a bar mark in a radius direction of said circular substrate, and said detecting includes receiving diffracted light from said mark.

7. A method of aligning a circular substrate according to claim 5, wherein said second stage is a rotatable stage on which said circular substrate is set such that the center of said substrate substantially coincides with a center of rotation of said second stage.

8. A method of aligning a circular substrate according to claim 5, wherein said detecting light irradiates two positions on said peripheral portion circumferentially spaced apart by a predetermined angle.

9. A method of aligning a circular substrate according to claim 5, wherein said mark is one of a pair of marks formed on said peripheral portion at two positions circumferentially spaced apart by a predetermined angle.

* * * * *

UNITED STATES PATENT AND TRADEMARK OFFICE
CERTIFICATE OF CORRECTION

PATENT NO.    : 5,737,441
DATED         : April 7, 1998
INVENTOR(S)   : Kenji NISHI It is certified that error appears in the above-indentified patent and that said Letters Patent is hereby corrected as shown below:

Claim 1:
   line 1, should read --A method of aligning a completely circular substrate with no cut-away portion in a prede- --.

Claim 3:
   line 1, should read --A method of aligning a completely circular substrate with no cut-away portion in a prede- --.

Claim 5:
   line 1, should read --A method of aligning a completely circular substrate with no cut-away portion in a prede- --.

Signed and Sealed this

Eleventh Day of August 1998

Attest:

BRUCE LEHMAN

*Attesting Officer*          *Commissioner of Patents and Trademarks*